(12) United States Patent
Michal et al.

(10) Patent No.: US 10,014,834 B1
(45) Date of Patent: Jul. 3, 2018

(54) DIFFERENTIAL SENSING CIRCUIT OF A FLOATING VOLTAGE SOURCE

(71) Applicant: STMicroelectronics (Alps) SAS, Grenoble (FR)

(72) Inventors: Vratislav Michal, Grenoble (FR); Denis Cottin, Crolles (FR); Patrik Arno, Sassenage (FR); Nicolas Marty, Saint Egreve (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 0 days.

(21) Appl. No.: 15/393,550

(22) Filed: Dec. 29, 2016

(51) Int. Cl.
H03F 3/45 (2006.01)
H03F 1/32 (2006.01)

(52) U.S. Cl.
CPC ........ *H03F 3/45071* (2013.01); *H03F 1/3211* (2013.01); *H03F 3/45* (2013.01); *H03F 3/45085* (2013.01); *H03F 2200/471* (2013.01); *H03F 2203/45544* (2013.01); *H03F 2203/45594* (2013.01)

(58) Field of Classification Search
CPC ............... H03F 3/45071; H03F 1/0205; H03F 3/45179; H03F 1/3211; H03F 3/45; H03F 3/45076; H03F 3/4508; H03F 3/45085; H03F 2203/45138; G01R 1/30; G01R 31/362; G01R 31/3682

USPC .................................................. 330/252–261
See application file for complete search history.

(56) References Cited

U.S. PATENT DOCUMENTS

| | | | |
|---|---|---|---|
| 8,395,447 B2 * | 3/2013 | Nakahashi | H03F 1/34 330/254 |
| 2013/0082777 A1 * | 4/2013 | Yoo | H03F 1/301 330/257 |
| 2013/0135047 A1 * | 5/2013 | Danioni | H03F 3/3022 330/252 |
| 2015/0236662 A1 * | 8/2015 | Ni | H03F 3/45479 330/258 |
| 2016/0072444 A1 * | 3/2016 | Gorbachov | H03F 1/301 330/261 |

* cited by examiner

*Primary Examiner* — Khanh V Nguyen
(74) *Attorney, Agent, or Firm* — Slater Matsil, LLP

(57) ABSTRACT

An embodiment circuit includes a first voltage divider coupled between a first voltage level and a ground potential. The circuit further includes an error amplifier having a first input terminal coupled to a node between a first resistive element and a second resistive element of the first voltage divider. The circuit further includes a second voltage divider coupled between a second voltage level and a reference voltage, wherein a second input terminal of the error amplifier is coupled to a node between a third resistive element and a fourth resistive element of the second voltage divider, and wherein an output voltage of the error amplifier is configured to control a potential difference between the first voltage level and the second voltage level.

21 Claims, 5 Drawing Sheets

DIFFERENTIAL SENSING CIRCUIT OF A FLOATING VOLTAGE SOURCE

TECHNICAL FIELD

The present disclosure relates generally to floating voltage sources, and, in particular embodiments, to a differential sensing circuit of a floating voltage source.

BACKGROUND

Floating voltage sources may be utilized to provide a substantially precise voltage in an electronic circuit. Such floating voltage sources add or subtract a predetermined voltage to a regulated voltage level to place an output voltage of the floating voltage source in an operable voltage range of a circuit. Floating voltage sources may be used in a device that receives its power over a wired connection (e.g. a universal serial bus (USB) connection, such as a USB Type-C connection). The floating voltage source in such a device generates an output voltage that is in an operable voltage range of low voltage components included in the device. The floating voltage source may further include a differential sensing circuit that monitors and regulates the output voltage to ensure that a substantially constant output voltage is provided to low voltage components included in the device. It may be desirable to provide a differential sensing circuit that has a stable feedback loop, that can achieve fast regulation of the output voltage, and that has simple circuit implementation with low power consumption.

SUMMARY

In an embodiment, a circuit includes a first voltage divider coupled between a first voltage level and a ground potential; an error amplifier having a first input terminal coupled to a node between a first resistive element and a second resistive element of the first voltage divider; and a second voltage divider coupled between a second voltage level and a reference voltage. A second input terminal of the error amplifier may be coupled to a node between a third resistive element and a fourth resistive element of the second voltage divider, and an output voltage of the error amplifier may be configured to control a potential difference between the first voltage level and the second voltage level.

In an embodiment, a circuit includes an amplifier having a first input terminal and a second input terminal; a first resistive element coupled between the first input terminal and a first voltage level; and a second resistive element coupled between the first input terminal and a ground potential. The circuit further includes a third resistive element coupled between the second input terminal and a second voltage level different from the first voltage level; a fourth resistive element coupled between the second input terminal and a non-zero reference voltage; and a load resistor coupled between the first voltage level and the second voltage level. The circuit further includes a pass transistor having a gate terminal coupled to an output terminal of the amplifier, wherein the pass transistor is configured to cause a current to flow through the load resistor in response to a voltage at the output terminal of the amplifier.

In an embodiment, a method includes providing a first voltage to a first input terminal of an error amplifier, the first voltage being determined based on a first voltage divider circuit coupled between a first voltage level and a ground potential. The method further includes providing a second voltage to a second input terminal of the error amplifier, the second voltage being determined based on a second voltage divider circuit coupled between a second voltage level and a non-zero reference voltage different from the ground potential. The method additionally includes regulating a potential difference between the first voltage level and the second voltage level based on the first voltage being equal to the second voltage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Figure 1:
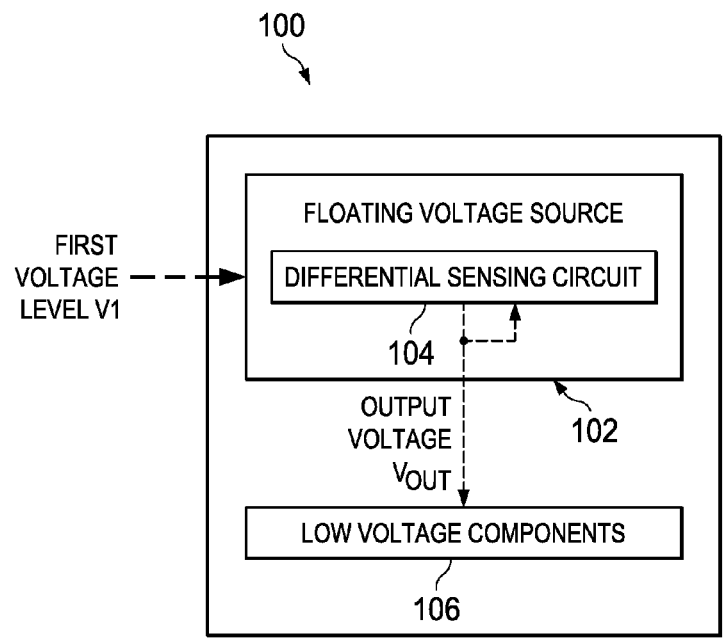
FIG. 1 shows a block diagram illustrating a device including a floating voltage source, a differential sensing circuit, and low voltage components, in accordance with an embodiment.

FIG. 1 shows a block diagram illustrating a device 100 including a floating voltage source 102, a differential sensing circuit 104, and low voltage components 106, in accordance with an embodiment. The device 100 may be a computer (e.g. a laptop computer), a mobile device (e.g. a user equipment or cell phone), or any other electronic device. As depicted in FIG. 1, the device 100 receives a first voltage level V1. In some embodiments, the first voltage level V1 may be a supply voltage that is generated or provided to the device 100 by an external power source or another device. The first voltage level V1 may be a voltage that is delivered by a connection (e.g. a wired connection), such as a USB Type-C connector that is adapted for faster data transfer rates and power-delivery over USB connections. The first voltage level V1 may be a variable voltage level that may vary from between about 4.5 V to about 25 V (e.g. referenced with respect to a ground potential). Such ranges for the first voltage level V1 may be possible in a USB Type C connector.

In some embodiments, the device 100 may be charged or powered using the first voltage level V1. For example, the high voltage provided by the first voltage level V1 may be sufficient to provide the wattage necessary to charge or power the device 100. As an example, a laptop computer may require up to about 60 W of power to charge, and the first voltage level V1 (e.g. delivered over a USB Type-C connection) may be sufficient to provide up to about 60 W of power to the laptop computer. However, the device 100 may also include low voltage components 106, which may include charge pumps, current limiters, current sensors, and transistors, as examples. The first voltage level V1 may be outside the operating range of the low voltage components 106. As such, the device 100 further includes a floating voltage source 102 that is configured to generate an output voltage $V_{OUT}$ that is within the operating range of the low voltage components 106. For example, the output voltage $V_{OUT}$ may be between about 2 V and about 3 V (e.g. about 2.5 V).

The device 100 includes a floating voltage source 102 that is configured to generate the output voltage $V_{OUT}$. In particular, the floating voltage source 102 generates a second voltage level V2 (not shown in FIG. 1; see FIGS. 2 to 5) based on the first voltage level V1. As an example, the second voltage level V2, generated by the floating voltage source 102, may track the variation of the first voltage level V1. In some embodiments, the difference between the first voltage level V1 and the second voltage level V2 may be referred to as a regulated floating voltage. The regulated floating voltage may be in a predetermined range, such as between about 2 V and about 3 V (e.g. about 2.5 V). In other words, the second voltage level V2 may regulated such that it is no more than about 2 V to about 3 V (e.g. about 2.5 V) less than the first voltage level V1. The regulated floating voltage is provided to the low voltage components 106 as the output voltage $V_{OUT}$, which, as described above may be between about 2 V and about 3 V (e.g. about 2.5 V).

The regulation of the second voltage level V2 is accomplished by a differential sensing circuit 104 that may be configured to ensure that the output voltage $V_{OUT}$ remains in the predetermined range (e.g. between about 2V and about 3 V). For example, as depicted in FIG. 1, the output voltage $V_{OUT}$ is provided to the low voltage components 106 and also fed back (via a feedback loop) to the differential sensing circuit 104 so that the differential sensing circuit 104 may compare the output voltage $V_{OUT}$ against a reference voltage $V_{REF}$ (not shown in FIG. 1; see FIGS. 2 to 5) and regulate the second voltage level V2 based on the comparison. Conventional implementations of the differential sensing circuit 104 are shown in FIGS. 2 and 3 and described below.

Figure 2:
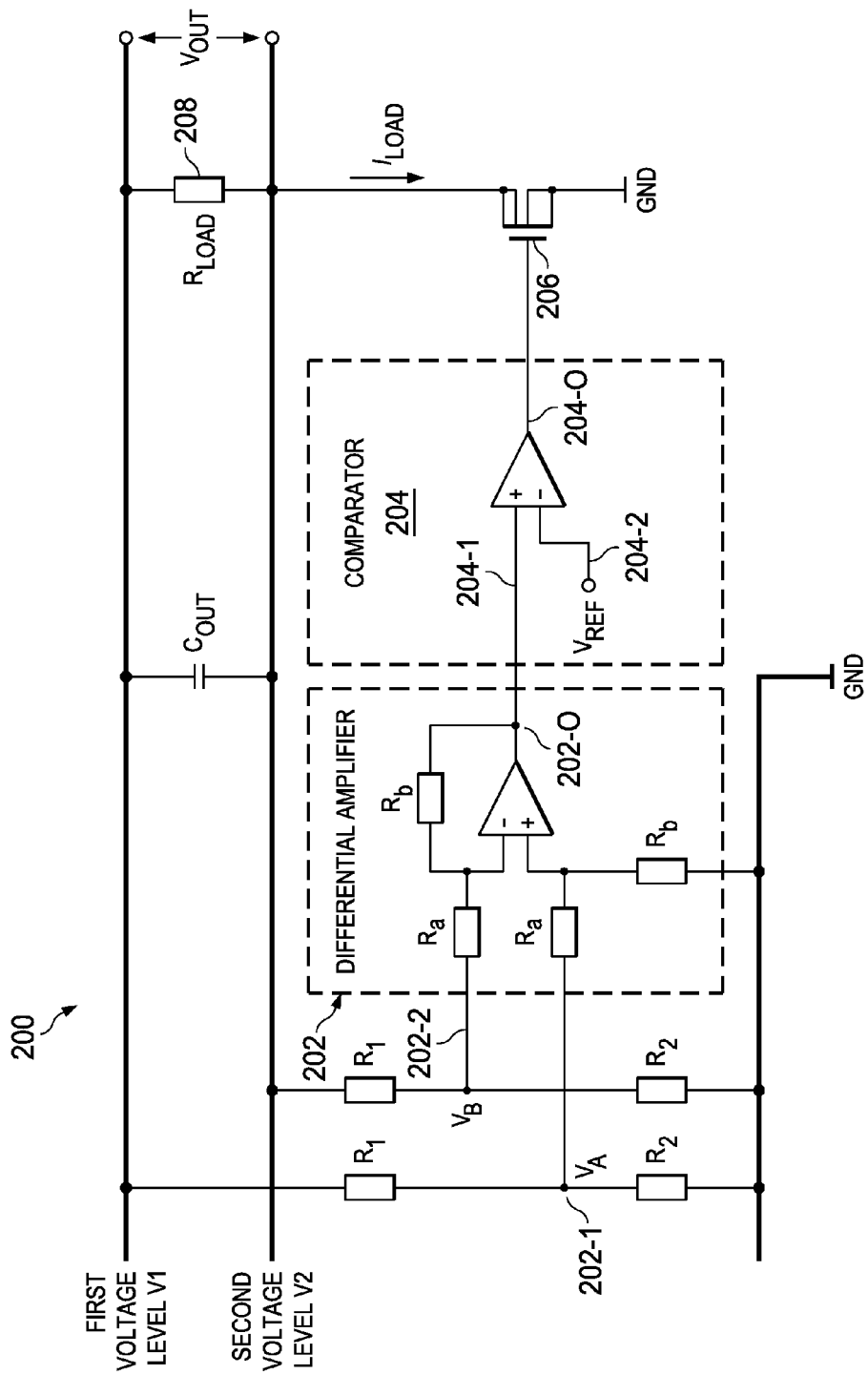
FIGS. 2 and 3 show conventional differential sensing circuits.
Figure 3:
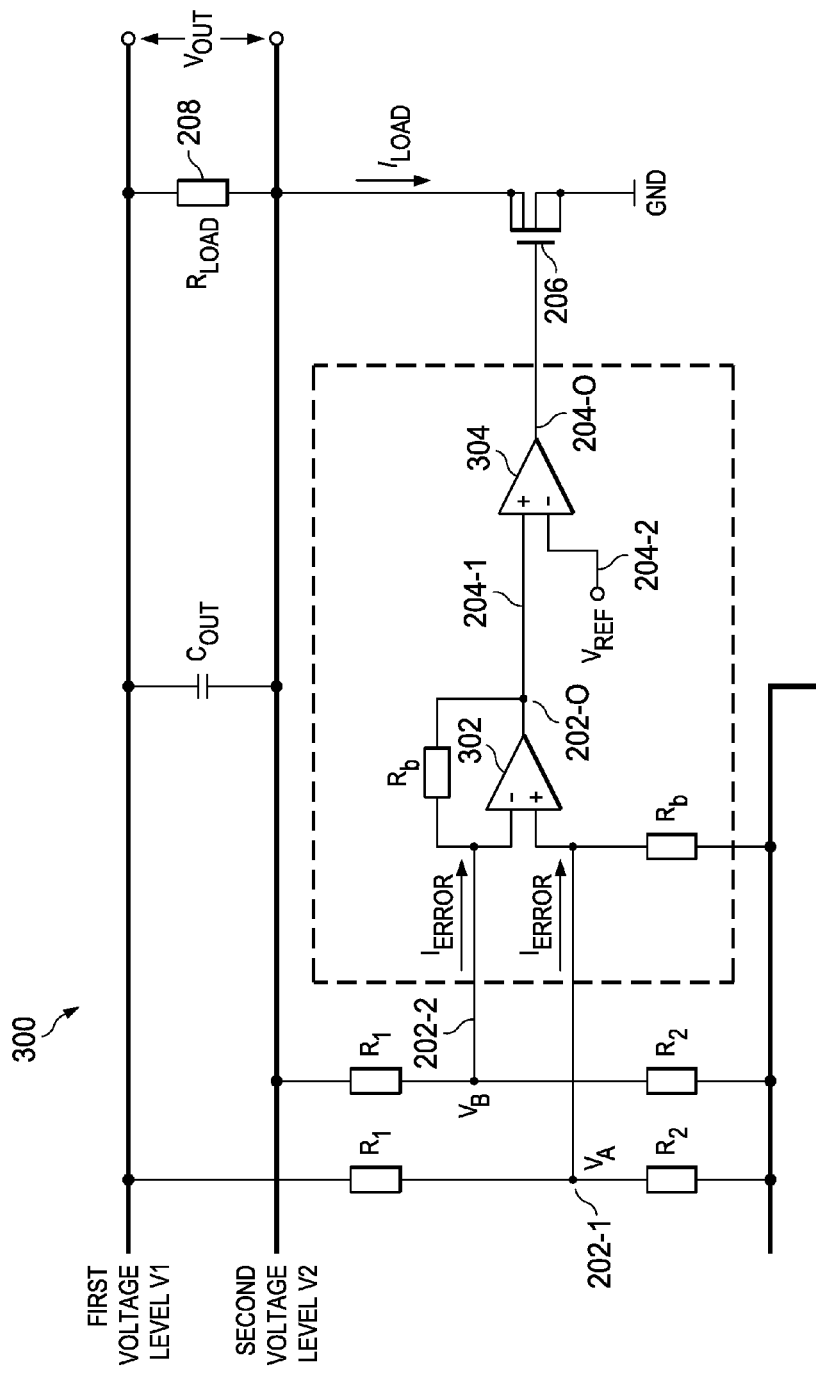

FIG. 2 shows a conventional differential sensing circuit 200, which may be used as the differential sensing circuit 104 shown in FIG. 1. The differential sensing circuit 200 includes a differential amplifier 202 and a comparator 204. The differential amplifier 202 includes a first input terminal 202-1 and a second input terminal 202-2. A first resistive element having a resistance R1 is connected between the first input terminal 202-1 (e.g. a non-inverting input) and the first voltage level V1, while a second resistive element having a resistance R2 is connected between the first input terminal 202-1 and a ground potential GND. Additionally, as depicted in FIG. 2, a third resistive element having a resistance R1 is connected between the second input terminal 202-2 (e.g. an inverting input) and the second voltage level V2, while a fourth resistive element having a resistance R2 is connected between the second input terminal 202-2 and the ground potential GND. As such, during operation of the differential sensing circuit 200, a voltage $V_A$ at the first input terminal 202-1 of the differential amplifier 202 may be expressed as R2·V1/(R1+R2), while a voltage $V_B$ at the second input terminal 202-2 of the differential amplifier 202 may be expressed as R2·V2/(R1+R2), assuming zero error current flowing into the input terminals 202-1, 202-2 of the differential amplifier 202. In order for zero error current to flow into the input terminals 202-1 and 202-2 of the differential amplifier, it follows that the resistive elements $R_a$ and $R_b$ included in the differential amplifier 202 have resistances that are much greater than the resistance R1 of the first and third resistive elements. Additionally, assuming that the resistive elements $R_a$ and $R_b$ included in the differential amplifier 202 are equal the differential amplifier 202 provides a unity gain (e.g. G=1) to the differential voltage at the input terminals 202-1 and 202-2 of the differential amplifier 202. In such an example, the voltage at an output terminal 202-0 of the differential amplifier 202 may be expressed as (V1−V2)·R2/(R1+R2)=$V_{OUT}$·R2/(R1+R2).

The output terminal 202-0 of the differential amplifier 202 is coupled to a first input terminal 204-1 (e.g. a non-inverting input) of the comparator 204. Additionally, a reference voltage $V_{REF}$ is provided to a second input terminal 204-2 (e.g. an inverting input) of the comparator 204. In some examples, the reference voltage $V_{REF}$ may be provided by a circuit, included in the device 100, having one or more current sources and one or more resistive elements. The circuit that provides the reference voltage $V_{REF}$ to the comparator 204 is not shown in FIG. 2 for the sake of simplicity. The differential sensing circuit 200 also includes a pass transistor 206 that is controlled by the comparator 204. The pass transistor 206 is configured to cause a controllable current $I_{LOAD}$ to flow through a load resistor 208 connected between the first voltage level V1 and the second voltage level V2, thereby regulating the output voltage $V_{OUT}$ across which the load resistor 208 is coupled. The load resistor 208 may be identified with the low voltage components 106 shown in FIG. 1. For example, the voltage $V_{OUT}$·R2/(R1+R2) at the first input terminal 204-1 of the comparator 204 is compared against the reference voltage $V_{REF}$ at the second input terminal 204-2 of the comparator 204. The output of the comparator 204 (which may be an error signal indicative of the difference between the voltage $V_{OUT}$·R2/(R1+R2) and the reference voltage $V_{REF}$) may drive the pass transistor 206 to increase the current $I_{LOAD}$ flowing through the load resistor 208 in response to the voltage $V_{OUT}$·R2/(R1+R2) being less than the reference voltage $V_{REF}$. However, in response to the voltage $V_{OUT}$·R2/(R1+R2) being greater than the reference voltage $V_{REF}$, the output of the comparator 204 may drive the pass transistor 206 to decrease the current $I_{LOAD}$ flowing through the load resistor 208. As such, the differential sensing circuit 200 operates to maintain a constant output substantially voltage $V_{OUT}$, which may be about 2 V to about 3 V.

Since the differential sensing circuit 200 shown in FIG. 2 requires zero error current and unity gain to operate in the manner described above, the resistive elements $R_a$ and $R_b$ included in the differential amplifier 202 need to be much greater (e.g. at least about to times greater) than the resistance R1 of the first and third resistive elements. As such, when the resistances R1 of the first and third resistive elements are in the mega-ohm range, then the resistive elements $R_a$ and $R_b$ included in the differential amplifier 202 may have to be unreasonably high resistances, thereby consuming high power and occupying large circuit area. Additionally, as depicted in the circuit 200 shown in FIG. 2, two operational amplifiers are included in the feedback loop (e.g. one included in the differential amplifier 202 and another included in the comparator 204). The inclusion of multiple (e.g. two or more) operational amplifiers in the feedback loop can lead to multiple (e.g. two or more) poles being present in the feedback loop, thus leading to instability and a slow regulation speed that may not be appropriate for some applications (e.g. USB Type-C, where fast regulation of the second voltage level V2 is needed).

FIG. 3 shows another conventional differential sensing circuit 300, which may be used as the differential sensing circuit 104 shown in FIG. 1. In contrast to the differential sensing circuit 200 shown in FIG. 2, the circuit 300 shown in FIG. 3 has resistive elements Ra included in the differential amplifier 202 replaced with the Thevenin resistance of the voltage divider circuit formed by resistances R1 and R2. By setting the resistive element $R_b$ to be equal to the resistance R2, the differential amplifier 302 has a unity gain and the difference between the first voltage level V1 and the second voltage level V2 (expressed as $V_{OUT}$) is equal to $V_{REF}$. As such, in the differential sensing circuit 300 shown in FIG. 3, provision of the reference voltage $V_{REF}$ in the feedback loop leads to an output voltage $V_{OUT}$ that is regulated to be substantially equal to $V_{REF}$. Consequently, resistances R1 and R2, as well as reference voltage $V_{REF}$, can be selected such that the voltage provided to the low voltage components 106 (e.g. $V_{REF}$) is within the predetermined range of the regulated floating voltage (e.g. between about 2 V and about 3 V). However, as with the differential sensing circuit 200 in FIG. 2, the circuit 300 in FIG. 3 also suffers from multiple (e.g. two or more) poles and multiple operational amplifiers being included in the feedback loop, thus leading to instability and slow regulation speed that may not be appropriate for some applications (e.g. USB Type-C, where fast regulation of the second voltage level V2 is needed).

In light of the above, it may be desirable to provide a differential sensing circuit that has a stable feedback loop, that can achieve fast regulation of the second voltage level V2, and that has simple circuit implementation with low power consumption.

Figure 4:
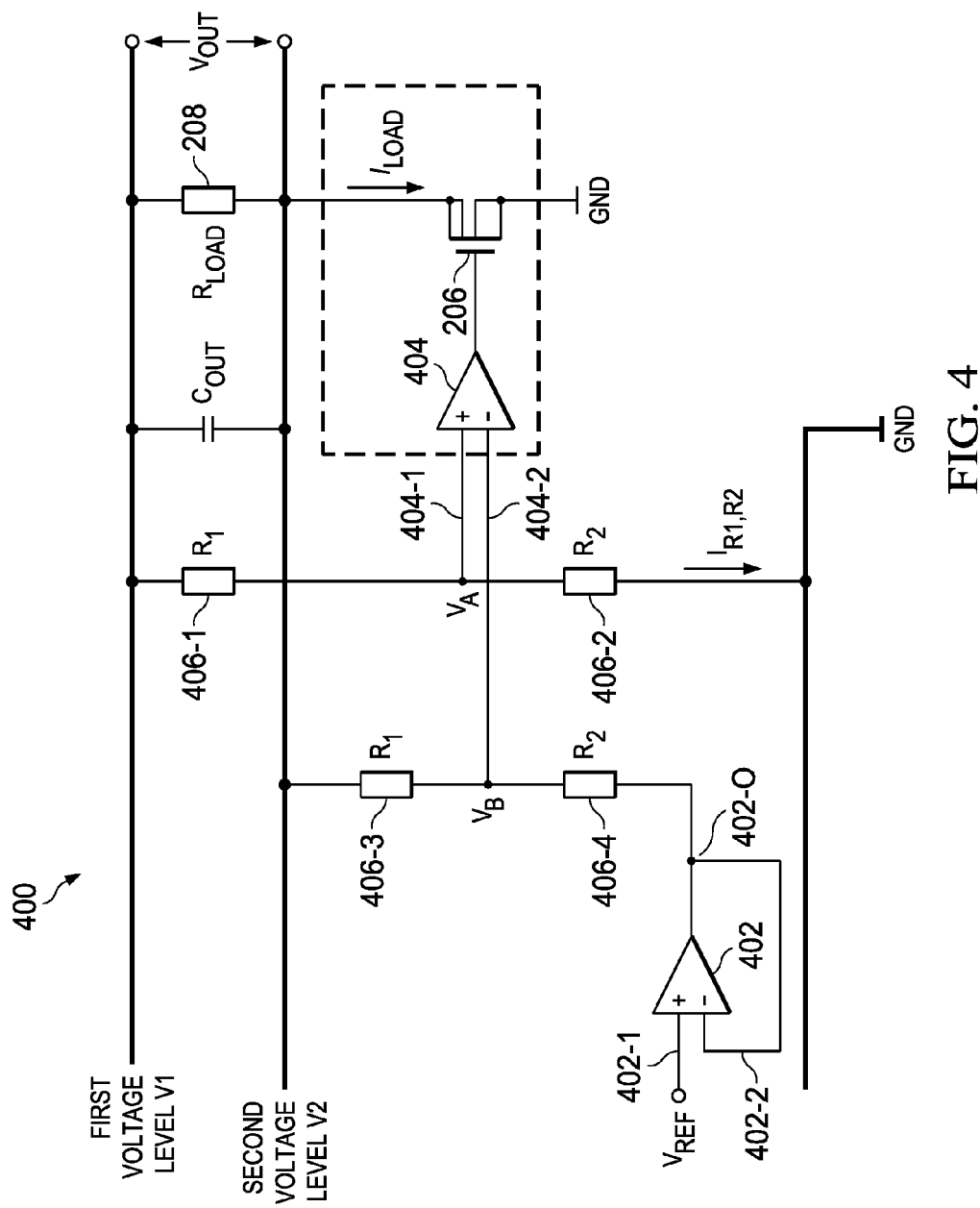
FIG. 4 shows a differential sensing circuit having a dissociated reference voltage, a voltage buffer, and an error amplifier, in accordance with an embodiment.

FIG. 4 shows a differential sensing circuit 400 having a dissociated reference voltage $V_{REF}$, a voltage buffer 402, and an error amplifier 404, in accordance with an embodiment. The differential sensing circuit 400 may be used as the differential sensing circuit 104 shown in FIG. 1. The differential sensing circuit 400 shown in FIG. 4 is able to provide floating source differential sensing with a stable feedback loop that achieves fast regulation of the second voltage level V2 and that has simple circuit implementation and low power consumption. In particular, as seen in FIG. 4, the dissociated reference voltage $V_{REF}$ is provided to the voltage follower 402 (or voltage buffer) that is separate from (e.g. connected outside of) the feedback loop. This is in contrast to the circuits 200 and 300 shown in FIGS. 2 and 3, where the reference voltage $V_{REF}$ is provided within the feedback loop (e.g. to the comparator 204 included in the feedback loop). Furthermore, as seen in FIG. 4, stability in the feedback loop is achieved by the inclusion of a single circuit element (e.g. the error amplifier 404) in the feedback loop. This is in contrast to the circuits 200 and 300 shown in FIGS. 2 and 3, where at least two circuit elements (e.g. the differential amplifier 202 and the comparator 204) are included in the feedback loop.

As depicted in FIG. 4, the differential sensing circuit 400 includes the voltage follower 402 having a first input terminal 402-1 (e.g. non-inverting input) and a second input terminal 402-2 (e.g. inverting input). The reference voltage $V_{REF}$ is provided to the first input terminal 402-1 (e.g. using a circuit similar to one described above in relation to FIG. 2), and this reference voltage $V_{REF}$ is outputted at an output terminal 402-0 of the voltage follower 402. The differential sensing circuit 400 further includes the error amplifier 404 having a first input terminal 404-1 (e.g. non-inverting input) and a second input terminal 404-2 (e.g. inverting input). A first resistive element 406-1 having resistance R1 is coupled between the first input terminal 404-1 of the error amplifier 404 and the first voltage level V1, while a second resistive element 406-2 having resistance R2 is coupled between the first input terminal 404-1 of the error amplifier 404 and the ground potential GND. Furthermore, as shown in FIG. 4, a third resistive element 406-3 having resistance R1 is coupled between the second input terminal 404-2 of the error amplifier 404 and the second voltage level V2, while a fourth resistive element 406-4 having resistance R2 is coupled between the second input terminal 404-2 of the error amplifier 404 and the output terminal 402-0 of the voltage follower 402.

As a result of the connections shown in FIG. 4, a voltage $V_A$ at the first input terminal 404-1 of the error amplifier 404 may be expressed as $R2 \cdot V1/(R1+R2)$. Similarly, a voltage $V_B$ at the second input terminal 404-2 of the error amplifier 404 may be expressed as $V2 \cdot R2/(R1+R2) + V_{REF} \cdot R1/(R1+R2)$. Following the superposition principle, the voltages $V_A$ and $V_B$ at the first input terminal 404-1 and the second input terminal 404-2 of the error amplifier 404 are equal. As such, $V2 \cdot R2/(R1+R2) + V_{REF} \cdot R1/(R1+R2) = R2 \cdot V1/(R1+R2)$, and, thus, $V_{OUT}$ (which is equal to V1–V2) is equal to $V_{REF} \cdot R1/R2$. Consequently, providing a dissociated reference voltage $V_{REF}$ outside of the feedback look of the differential sensing circuit 400 can lead to a regulated floating voltage $V_{OUT}$ that is equal to $V_{REF} \cdot R1/R2$. Based on the maximum voltage that may be used by the low voltage components 106, the resistances R1 and R2, as well as the dissociated reference voltage $V_{REF}$, can be chosen such that the voltage provided to the low voltage components 106 (e.g. $V_{REF} \cdot R1/R2$) is within the predetermined range of the regulated floating voltage (e.g. between about 2 V and about 3 V). Since the output voltage $V_{OUT}$ in FIG. 4 depends on a ratio of resistances R1 and R2, and since use of a differential amplifier is avoided in the feedback loop of FIG. 4, the need for additional resistance elements having resistances greater than R1 or R2 is avoided. As can be seen in FIG. 4, the voltage follower 402 is configured to produce the reference voltage $V_{REF}$ at a terminal of the fourth resistive element 406-4, while the voltage regulation is accomplished by the error amplifier 404. Since a single operational amplifier (e.g. the error amplifier 404) is used in the feedback loop, a stable feedback loop is created, and this stable feedback loop achieves fast regulation of the second voltage level V2 with simple circuit implementation and low power consumption.

In order to provide low current $I_{R1,R2}$ (e.g. in the microampere range) in the voltage divider circuits formed by the first and second resistive elements 406-1 and 406-2, the resistances R1 and R2 may need to be in the mega-ohm range. However, use of such large resistances can slow down the transient response of the feedback loop of the differential sensing circuit 400 shown in FIG. 4 due to the addition of an extra pole in the feedback loop of the differential sensing circuit 400. The effect of the pole created by the use of a large resistance R1 can be compensated for using the differential sensing circuit 500 shown in FIG. 5.

Figure 5:
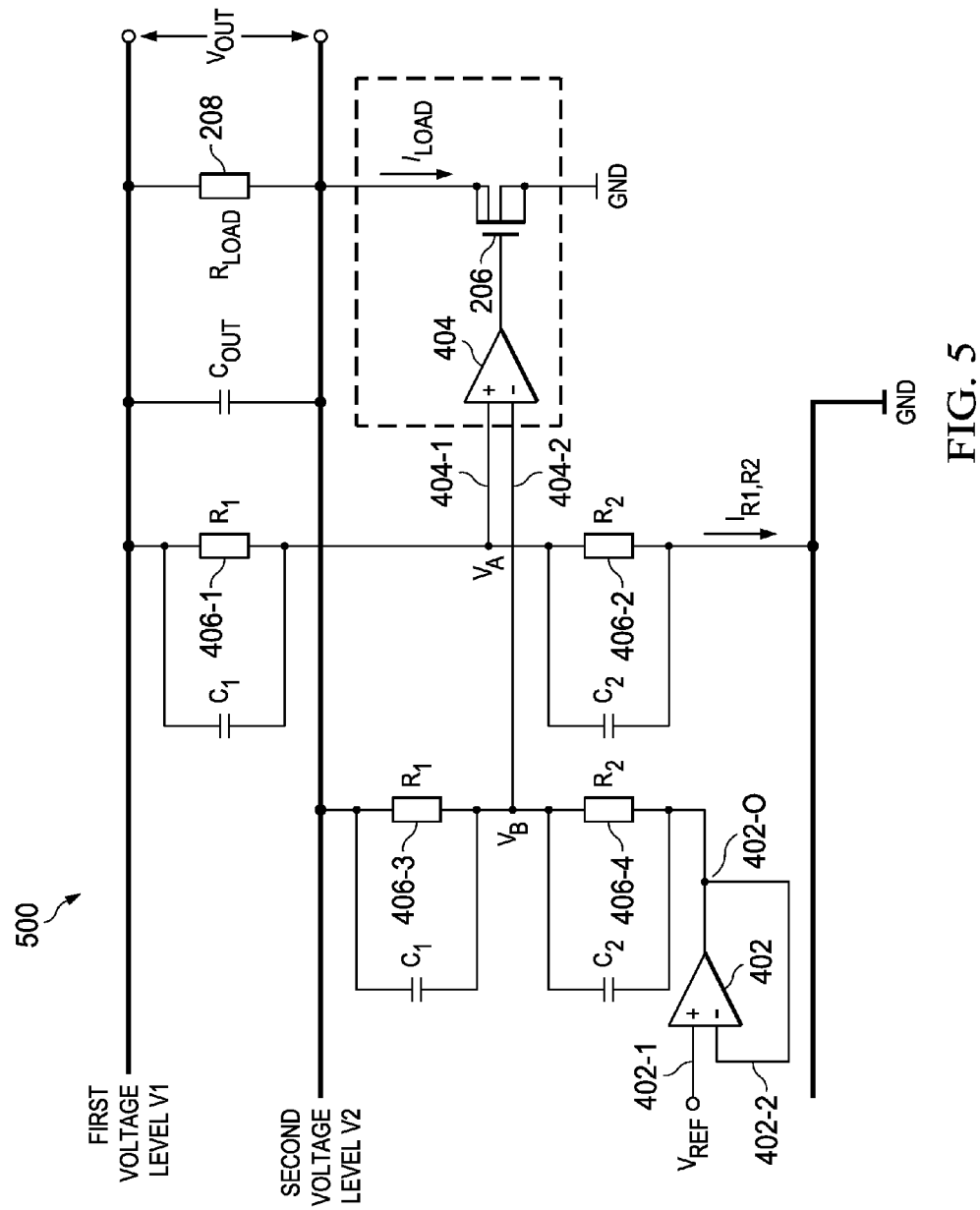
FIG. 5 shows a differential sensing circuit having a dissociated reference voltage, a voltage buffer, an error amplifier, and a frequency-compensated voltage divider circuit, in accordance with an embodiment.

FIG. 5 shows a differential sensing circuit 500 having a dissociated reference voltage $V_{REF}$, a voltage buffer 402, an error amplifier 404, and a frequency-compensated voltage divider circuit, in accordance with an embodiment. The differential sensing circuit 500 may be used as the differential sensing circuit 104 shown in FIG. 1. In particular, the frequency-compensated voltage divider circuit may be formed by coupling a first capacitive element having a capacitance C1 in parallel to the first resistive element 406-1, and coupling a second capacitive element having a capacitance C2 in parallel to the second resistive element 406-2. Similarly, a third capacitive element having a capacitance C1 is coupled in parallel to the third resistive element 406-3, and a fourth capacitive element having a capacitance C2 is coupled in parallel to the fourth resistive element 406-4. As described above in relation to FIG. 4, use of a large resistance R1 for the first and third resistive elements 406-1 and 406-3 leads to the addition of a pole in the feedback loop. In the example shown in FIG. 5, the capacitance C2 is chosen to be greater than a parasitic capacitance at the input terminals of the error amplifier 404 and thus, the poles in the feedback loop are dependent on the resistive elements having resistance R1 and the capacitive elements having capacitance C2. In order to compensate for the pole formed by the capacitive elements having capacitance C2 and the resistive elements having resistance R1, a zero is added in the feedback loop by use of the capacitive elements having capacitance C2. To ensure that the zero formed by the capacitive elements having capacitance C2 compensates for the pole formed by the capacitive elements having capacitance C1 and the resistive elements having resistance R1, the values of R1, R2, C1 and C2 are chosen subject to the condition that R1/R2=C2/C1. In so doing, a frequency compensated voltage divider is formed and this allows the differential sensing circuit 500 to have a flat frequency response and low equivalent impedance.

In summary, the differential sensing circuits 400 and 500 shown in FIGS. 4 and 5 make use of the superposition principle to greatly simplify the design of a high-voltage low drop-out circuit. The differential sensing circuits 400 and 500 shown in FIGS. 4 and 5 also have improved accuracy and stability (e.g. in comparison to the circuits shown in FIGS. 2 and 3) due to the following: (1) reduction of in-loop active elements in the feedback loop (e.g. by removing the frequency response of a differential amplifier in the feedback loop); (2) providing a dissociated reference voltage to a resistive element of a voltage divider circuit outside of the feedback loop; and (3) use of superposition differential sensing. As such, the differential sensing circuits 400 and 500 shown in FIGS. 4 and 5 have stable feedback loops that achieve fast regulation of a floating voltage with simple circuit implementation and low power consumption.

Figure 6:
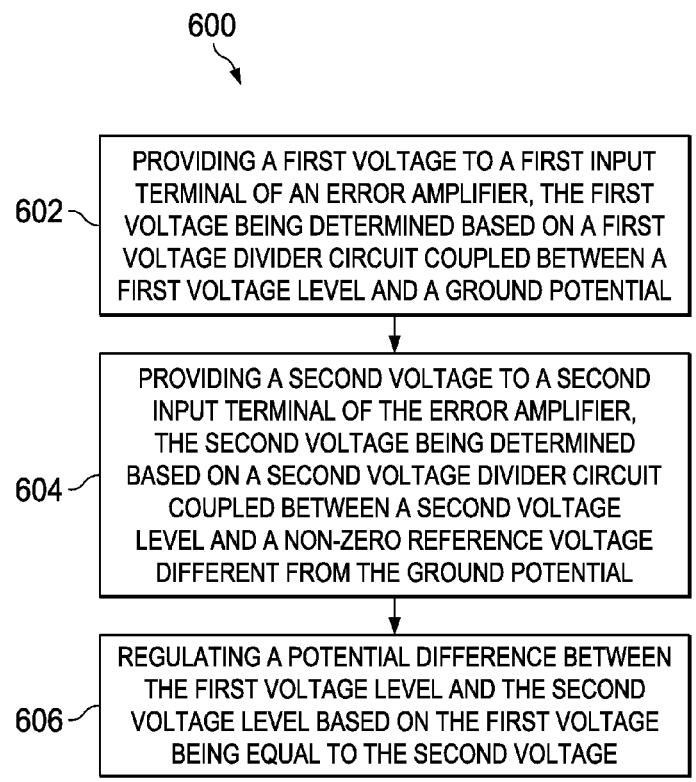
FIG. 6 shows a method of regulating an output voltage of a floating voltage source, in accordance with an embodiment.

FIG. 6 shows a method 6 of regulating an output voltage of a floating voltage source, in accordance with an embodiment. The method 600 may be used, as an example, to regulate the output voltage $V_{OUT}$ denoted in the differential sensing circuits 400 and 500 shown in FIGS. 4 and 5. Method 600 includes step 602, which includes providing a first voltage (e.g. voltage $V_A$ in FIGS. 4 and 5) to a first input terminal 404-1 of an error amplifier 404, where the first voltage is determined based on a first voltage divider circuit (e.g. including resistive elements 406-1 and 406-2) coupled between a first voltage level (e.g. first voltage level V1 in FIGS. 4 and 5) and a ground potential (e.g. ground potential GND in FIGS. 4 and 5). Method 600 also includes step 604, which includes providing a second voltage (e.g. voltage $V_B$ in FIGS. 4 and 5) to a second input terminal 404-2 of the error amplifier 404, where the second voltage is determined based on a second voltage divider circuit (e.g. including resistive elements 406-3 and 406-4) coupled between a second voltage level (e.g. second voltage level V2 in FIGS. 4 and 5) and a non-zero reference voltage (e.g. dissociated reference voltage $V_{REF}$ in FIGS. 4 and 5) different from the ground potential. Method 600 also includes step 606, which includes regulating a potential difference (e.g. the output voltage $V_{OUT}$ in FIGS. 4 and 5) between the first voltage level and the second voltage level based on the first voltage being equal to the second voltage (e.g. $V_A=V_B$, based on the superposition principle).

In an embodiment, a circuit includes a first voltage divider coupled between a first voltage level and a ground potential; an error amplifier having a first input terminal coupled to a node between a first resistive element and a second resistive element of the first voltage divider; and a second voltage divider coupled between a second voltage level and a reference voltage. A second input terminal of the error amplifier may be coupled to a node between a third resistive element and a fourth resistive element of the second voltage divider, and an output voltage of the error amplifier may be configured to control a potential difference between the first voltage level and the second voltage level.

In an embodiment, a circuit includes an amplifier having a first input terminal and a second input terminal; a first resistive element coupled between the first input terminal and a first voltage level; and a second resistive element coupled between the first input terminal and a ground potential. The circuit further includes a third resistive element coupled between the second input terminal and a second voltage level different from the first voltage level; a fourth resistive element coupled between the second input terminal and a non-zero reference voltage; and a load resistor coupled between the first voltage level and the second voltage level. The circuit further includes a pass transistor having a gate terminal coupled to an output terminal of the amplifier, wherein the pass transistor is configured to cause a current to flow through the load resistor in response to a voltage at the output terminal of the amplifier.

In an embodiment, a method includes providing a first voltage to a first input terminal of an error amplifier, the first voltage being determined based on a first voltage divider circuit coupled between a first voltage level and a ground potential. The method further includes providing a second voltage to a second input terminal of the error amplifier, the second voltage being determined based on a second voltage divider circuit coupled between a second voltage level and a non-zero reference voltage different from the ground potential. The method additionally includes regulating a potential difference between the first voltage level and the second voltage level based on the first voltage being equal to the second voltage.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit, comprising:
a first voltage divider coupled between a first voltage level and a ground potential;
an error amplifier having a first input terminal coupled to a node between a first resistive element and a second resistive element of the first voltage divider; and
a second voltage divider coupled between a second voltage level and a reference voltage, wherein a second input terminal of the error amplifier is coupled to a node between a third resistive element and a fourth resistive element of the second voltage divider, and wherein an output voltage of the error amplifier is configured to control a potential difference between the first voltage level and the second voltage level.

2. The circuit of claim 1, wherein a first terminal and a second terminal of the third resistive element are coupled to the second voltage level and the second input terminal of the error amplifier, respectively, and wherein a first terminal and a second terminal of the fourth resistive element are coupled to the second input terminal of the error amplifier and the reference voltage, respectively.

3. The circuit of claim 2, further comprising a voltage buffer configured to provide the reference voltage to the second terminal of the fourth resistive element.

4. The circuit of claim 1, wherein a first terminal and a second terminal of the first resistive element are coupled to the first voltage level and the first input terminal of the error amplifier, respectively, and wherein a first terminal and a second terminal of the second resistive element are coupled to the first input terminal of the error amplifier and the ground potential, respectively.

5. The circuit of claim 1, wherein the potential difference between the first voltage level and the second voltage level is substantially equal to the reference voltage multiplied by a gain factor.

6. The circuit of claim 5, wherein the gain factor is substantially equal to a ratio of a resistance of the first resistive element to a resistance of the second resistive element.

7. The circuit of claim 1, wherein a resistance of the first resistive element is equal to a resistance of the third resistive element, and wherein a resistance of the second resistive element is equal to a resistance of the fourth resistive element.

8. The circuit of claim 1, further comprising:
a load resistor coupled between the first voltage level and the second voltage level; and
a pass transistor having a gate terminal coupled to an output terminal of the error amplifier, the pass transistor configured to cause a current to flow through the load resistor based on the output voltage of the error amplifier.

9. A circuit, comprising:
an amplifier having a first input terminal and a second input terminal;
a first resistive element coupled between the first input terminal and a first voltage level;
a second resistive element coupled between the first input terminal and a ground potential;
a third resistive element coupled between the second input terminal and a second voltage level different from the first voltage level;
a fourth resistive element coupled between the second input terminal and a non-zero reference voltage;
a load resistor coupled between the first voltage level and the second voltage level; and
a pass transistor having a gate terminal coupled to an output terminal of the amplifier, wherein the pass transistor is configured to cause a current to flow through the load resistor in response to a voltage at the output terminal of the amplifier.

10. The circuit of claim 9, wherein the first input terminal and the second input terminal of the amplifier comprise a non-inverting input and an inverting input of the amplifier, respectively.

11. The circuit of claim 9, wherein the first voltage level is between about 20 V and about 25 V.

12. The circuit of claim 9, wherein a potential difference between the first voltage level and the second voltage level is between about 2 V and about 3V.

13. The circuit of claim 9, further comprising:
a first capacitive element coupled in parallel to the first resistive element;
a second capacitive element coupled in parallel to the second resistive element;
a third capacitive element coupled in parallel to the third resistive element; and a fourth capacitive element coupled in parallel to the fourth resistive element.

14. The circuit of claim 13, wherein a capacitance of the first capacitive element is equal to a capacitance of the third capacitive element, and wherein a capacitance of the second capacitive element is equal to a capacitance of the fourth capacitive element.

15. The circuit of claim 13, wherein a resistance of the first resistive element is equal to a resistance of the third resistive element, and wherein a resistance of the second resistive element is equal to a resistance of the fourth resistive element.

16. The circuit of claim 13, wherein a ratio of a capacitance of the first capacitive element to a capacitance of the second capacitive element is equal to a ratio of a resistance of the first resistive element to a resistance of the second resistive element.

17. The circuit of claim 9, further comprising a voltage buffer configured to output the non-zero reference voltage to a terminal of the fourth resistive element.

18. A method, comprising:
    providing a first voltage to a first input terminal of an error amplifier, the first voltage being determined based on a first voltage divider circuit coupled between a first voltage level and a ground potential;
    providing a second voltage to a second input terminal of the error amplifier, the second voltage being determined based on a second voltage divider circuit coupled between a second voltage level and a non-zero reference voltage different from the ground potential; and
    regulating a potential difference between the first voltage level and the second voltage level based on the first voltage being equal to the second voltage.

19. The method of claim 18, wherein the first input terminal and the second input terminal of the error amplifier comprise a non-inverting terminal and an inverting terminal of the error amplifier, respectively.

20. The method of claim 18, wherein the potential difference between the first voltage level and the second voltage level is regulated to be between about 2 V and about 3 V.

21. The method of claim 18, further comprising:
    buffering the non-zero reference voltage at an output terminal of a voltage follower; and
    providing the non-zero reference voltage to a terminal of the second voltage divider circuit.

* * * * *